United States Patent [19]
Holland et al.

[11] Patent Number: 5,278,458
[45] Date of Patent: Jan. 11, 1994

[54] THRESHOLD/VOLTAGE DETECTION CIRCUIT

[75] Inventors: Wayland B. Holland, Garland; Gary L. Howe, Stafford; John F. Schreck, Houston, all of Tex.

[73] Assignee: Texas Instruments Incorporated, Dallas, Tex.

[21] Appl. No.: 807,545

[22] Filed: Dec. 13, 1991

[51] Int. Cl.$^5$ .................... H05K 3/01; H05K 5/153
[52] U.S. Cl. .................... 307/272.3; 307/354; 307/358; 307/346; 307/296.4; 307/296.5
[58] Field of Search ............ 307/350, 354, 358, 546, 307/296.1, 272.3, 296.4–.5

[56] References Cited

U.S. PATENT DOCUMENTS

| | | | |
|---|---|---|---|
| 4,812,680 | 3/1989 | Kawashima et al. | 307/354 |
| 4,825,099 | 4/1989 | Barton | 307/354 |
| 5,030,845 | 7/1991 | Love et al. | 307/272.3 |
| 5,039,875 | 8/1991 | Chang | 307/272.3 |
| 5,074,572 | 12/1991 | Poteet et al. | 307/354 |

*Primary Examiner*—Margaret R. Wambach
*Attorney, Agent, or Firm*—Theodore D. Lindgren; Leo N. Heiting; Richard L. Donaldson

[57] ABSTRACT

One aspect of the present invention includes a circuit for detecting when an input voltage exceeds a predetermined threshold. The circuit for detecting includes an input for receiving the input voltage. Further, the circuit includes a plurality of switching devices, wherein each of the switching devices comprises a first and second terminal for defining a variable conductive path, and a third terminal for receiving a signal to control said variable conductive path. The plurality of switching devices includes three switching devices. The first switching device has a first terminal coupled to the input and a second terminal coupled to a first node. The second switching device has a first terminal coupled to the first node and a second terminal coupled to a second node. Finally, the third switching device has a first terminal coupled to the second node. Each of the first, second and third switching devices are of like conductivity type, and the second node provides a first voltage if the input voltage is below the predetermined threshold and provides a second voltage if the input voltage is above the predetermined threshold.

18 Claims, 1 Drawing Sheet

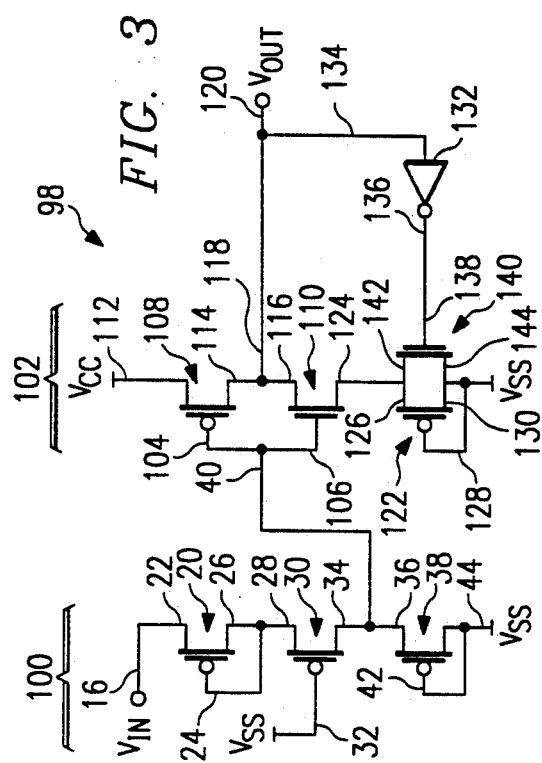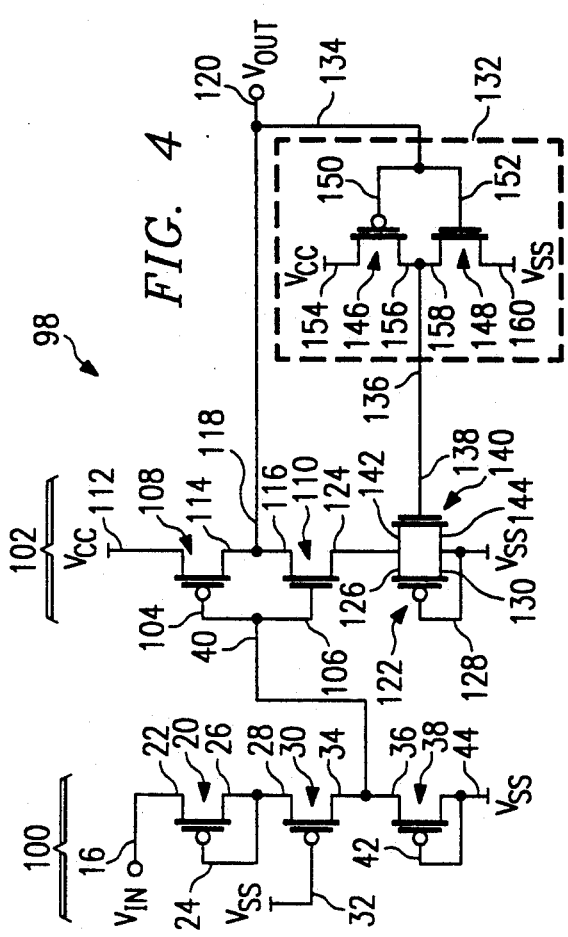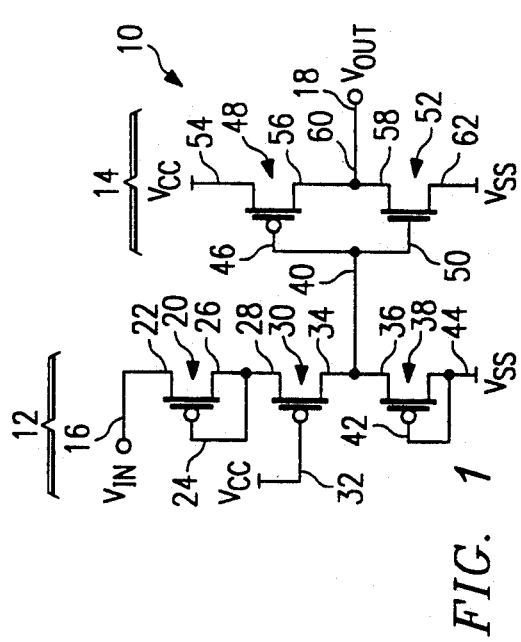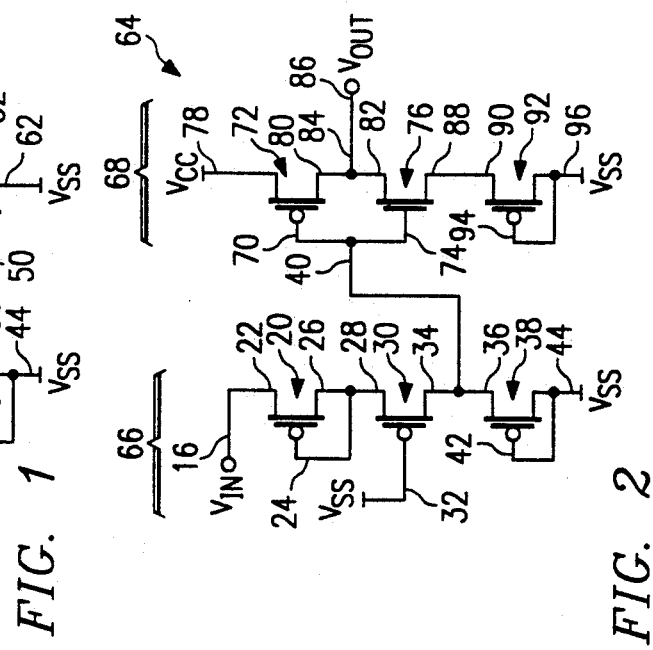

THRESHOLD/VOLTAGE DETECTION CIRCUIT

TECHNICAL FIELD OF THE INVENTION

This invention relates in general to integrated circuitry and, more particularly, to a circuit for the detection of a voltage passing a predetermined threshold.

BACKGROUND OF THE INVENTION

In integrated circuit technology, there is virtually an unlimited number of instances where a voltage level must be analyzed in order to determine whether it falls above or below a particular threshold. The specific value of the threshold voltage is dependent upon the overall circuit or system which provides the analyzed voltage.

The prior art has provided various techniques for detecting threshold voltages. Many of these techniques have both advantages and disadvantages associated with them. One known technique includes a circuit having an input stage wherein two P channel transistors are connected to an N channel transistor. In this technique, the P channel transistors must be constructed in one area on the semiconductor device while the N channel transistor must be constructed in a separate area. For example, the N channel transistor may be formed on a P type semiconductor substrate, while the P channel transistors may be formed in a separate N tank formed within the P type substrate. Thus, a considerable amount of area is consumed in order to lay out this prior art circuit.

An additional disadvantage with the above-described prior art technique arises from the increased possibility of a latch-up condition. The combination of P channel and N channel transistors and the possibility of high input voltages increase the possibility of this latch-up condition. Latch-up occurs where the so-called parasitic devices within the circuit inadvertently are turned on and remain on. Parasitic devices are undesirable inherent effects that naturally occur due to certain characteristics of the circuit. Once the parasitic devices turn on, the circuit most likely will not work properly. Indeed in many instances, once a latch-up condition has occurred, this condition may remain even though the inputs to the circuit are changed. As a result, the circuit may not only work improperly, but in addition, damage may occur to both the circuit and the system containing the circuit. Thus, it may be appreciated that this prior art input configuration is often highly undesirable.

Therefore, a need has arisen for a threshold detection circuit which minimizes the amount of surface layout necessary for the circuit, isolates the relative high voltages of the circuit and substantially reduces the possibility of the circuit going into a latch-up condition.

SUMMARY OF THE INVENTION

In accordance with the present invention, a circuit for detecting a threshold voltage is provided which substantially eliminates or reduces disadvantages and problems associated with prior threshold circuit detection schemes.

One aspect of the present invention includes a circuit for detecting when an input voltage exceeds a predetermined threshold. The circuit for detecting includes an input for receiving the input voltage. Further, the circuit includes a plurality of switching devices, wherein each of the switching devices comprises a first and second terminal for defining a variable conductive path, and a third terminal for receiving a signal to control said variable conductive path. The plurality of switching devices includes three switching devices. The first switching device has a first terminal coupled to the input and a second terminal coupled to a first node. The second switching device has a first terminal coupled to the first node and a second terminal coupled to a second node. Finally, the third switching device has a first terminal coupled to the second node. Each of the first, second and third switching devices are of like conductivity type, and the second node provides a first voltage if the input voltage is below the predetermined threshold and provides a second voltage if the input voltage is above the predetermined threshold.

The various concepts of the present invention provide numerous technical advantages. For example, one technical advantage is the inclusion of transistors or switching devices in the input stage of the circuit having the same type of semiconductor conductivity-type. This like conductivity-type structure permits the input stage to be constructed within a small area on a semiconductor device and, therefore, has the technical advantage of reducing the size of the device. Still another technical advantage arising from these like conductivity-type devices is an improved isolation of the input stage. As a result, any high voltages associated with the input stage are likewise isolated and, therefore, there is the technical advantage that the risk of a latch-up condition is substantially reduced. By reducing the risk of a latch-up condition, there is another technical advantage of reducing the chance of damage to the circuit. Finally, the reduced risk of damage to the circuit provides the technical advantage of reducing the overall risk to not only the circuit, but the system including the circuit as well.

BRIEF DESCRIPTION OF THE DRAWINGS

For a more complete understanding of the present invention and the advantages thereof, reference is now made to the following description taken in conjunction with the accompanying drawings in which:

FIG. 1 illustrates a schematic of a threshold detection circuit having an input stage and an output stage;

FIG. 2 illustrates a schematic of a threshold detection circuit having an input stage and an output stage, wherein the source of the N channel transistor in the output stage is biased at one P channel threshold voltage above $V_{ss}$;

FIG. 3 illustrates the schematic of FIG. 2 including a feedback loop for purposes of selectively connecting the N channel transistor in the output stage to $V_{ss}$; and FIG. 4 illustrates the schematic of FIG. 3 including a CMOS transistor pair utilized for accomplishing the inverter function illustrated in FIG. 3.

DETAILED DESCRIPTION OF THE INVENTION

The preferred embodiments of the present invention are illustrated in FIGS. 1–4 of the drawings, like numerals being used to refer to like and corresponding parts of the various drawings.

FIG. 1 illustrates a schematic of a threshold detection circuit denoted generally at 10. Threshold detection circuit 10 includes an input stage 12 and an output stage 14. Input stage 12 has an input terminal 16 and output stage 14 has an output terminal 18. In operation, threshold detection circuit 10 receives a voltage, $V_{IN}$, at input terminal 16. Output terminal 18 consequently provides an output voltage, $V_{OUT}$, whose state depends on the value of the input voltage received at input terminal 16. In particular, the output voltage, $V_{OUT}$, will represent one level if the input voltage, $V_{IN}$, is below a predetermined threshold and will represent a different output voltage if the input voltage is above a predetermined threshold. Thus, the circuit analyzes, or detects, when the input voltage moves above and/or below a predetermined threshold voltage. The particular interaction of the components of circuit 10 and the adjustability of the threshold voltage are discussed in greater detail below.

The particular components and their respective interconnections within FIG. 1 are as follows. Input terminal 16 is connected to a P channel transistor 20. More particularly, input terminal 16 is connected the source 22 of P channel transistor 20. The gate 24 of P channel transistor 20 is connected to the drain 26 of P channel transistor 20. With respect to P channel transistor 20, as well as the other transistors discussed herein, it should be understood that the terms source, drain and gate are used as known in the art, but are in no way intended to limit the scope of the present invention. Thus, any switching device may be used in lieu of the transistors without departing from the spirit and scope of this invention. Each of those devices would need merely a first and second terminal which have an adjustable conductive path between the two terminals. Thus, in the instance of P channel transistor 20, source 22 and drain 26 form first and second terminals having a conductive path between them, and that conductive path is controlled by the relative potentials of those terminals with respect to the voltage at gate 24. This same general principle applies to all other transistors discussed herein.

Drain 26 of P channel transistor 20 is further connected to the source 28 of a P channel transistor 30. The gate 32 of P channel transistor 30 is connected to a high potential voltage source, $V_{cc}$. In the preferred embodiment, this high voltage source is 5 volts; however, it should be understood that the high voltage source, $V_{cc}$, may be set to any potential as is known in the art. The drain 34 of P channel transistor 30 is connected to the source 36 of a P channel transistor 38. This connection of drain 34 to source 36 defines a node 40 between those two components. The gate 42 of P channel transistor 38 is connected to the drain of 44 of P channel transistor 38. Drain 44 is further connected to a low potential voltage source, $V_{ss}$. In the preferred embodiment, low voltage source, $V_{ss}$, is connected to ground; however, similar to $V_{cc}$ it should be understood that low voltage source, $V_{ss}$, may be connected to other relatively low power supply levels as is known in the art.

Node 40 is connected to output stage 14. In particular, node 40 is connected to the gate 46 of a P channel transistor 48. Additionally, node 40 is connected to the gate 50 of an N channel transistor 52. The source 54 of P channel transistor 48 is connected to the high voltage source, $V_{cc}$. The drain 56 of P channel transistor 48 is connected to the drain 58 of N channel transistor 52. The connections of drain 56 to drain 58 define a node 60 between those connections. Node 60 is connected to output terminal 18 and, therefore, provides the output voltage, $V_{OUT}$. The source 62 of N channel transistor 52 is connected to the low voltage source, $V_{ss}$.

As discussed in general above, threshold detection circuit 10 operates to receive an input voltage, $V_{IN}$, at input terminal 16 and provide an output voltage, $V_{OUT}$, at its output terminal 18. Further, the state of the output voltage depends upon whether or not the input voltage exceeds a predetermined threshold value. The particular voltages of FIG. 1 are best understood when discussed in connection with the values shown immediately below in Table 1.

TABLE 1

| $V_{IN}$ | (volts) Node 40 | $V_{OUT}$ |
|---|---|---|
| 0 (lo) | $\leq$ PVT | approximately $V_{cc}$ (hi) |
| $> V_{cc}$ + 2 PVT (hi) | approximately $V_{IN}$ - PVT | $V_{ss}$ (lo) |

Table 1 illustrates two general states of operation for threshold detection circuit 10. The first row of Table 1 indicates the operational state for an input voltage of roughly 0 volts (i.e., a logic low signal). During this state, the voltage at node 40 will be no greater than one threshold voltage of a P channel transistor. For abbreviation purposes, this one threshold voltage for a P channel transistor is abbreviated as "PVT". This one PVT voltage at node 40 arises because, during this state, P channel transistors 20 and 30 are off while P channel transistor 38 is on. As a result, node 40 is connected through P channel transistor 38 to the low voltage source, $V_{ss}$. However, P channel transistor 38 may have up to one PVT voltage drop across it and, therefore, the voltage at node 40 is less than or equal to one PVT.

Continuing with the first row of Table 1, it may be appreciated that when the input voltage, $V_{IN}$, is low, the output voltage, $V_{OUT}$, is approximately equal to $V_{cc}$ (i.e., a logic high). This voltage is merely approximate due to the potential loss of voltage across N channel transistor 52. More particularly, because up to one PVT exists at node 40, P channel transistor 48 is well into its conductive state and, therefore, connects node 60 and output terminal 18 to the high voltage source, $V_{cc}$, at source 54. However, it should be noted that a one PVT voltage at node 40 may inadvertently cause N channel transistor 52 to ever so slightly conduct. In the instance that transistor 52 may inadvertently conduct, some voltage will be lost across transistor 52, thereby depleting or reducing the voltage at output terminal 18. As a result, it is stated in Table 1 that where the input voltage is 0 volts, the output voltage is only approximately equal to $V_{cc}$.

The second row of Table 1 illustrates the state of operation of detection circuit 10 for a second input voltage. In particular, the second row illustrates an input voltage greater than $V_{cc}$ plus two P channel threshold voltages (i.e., two PVT). During this state, the voltage at node 40 is approximately equal to the input voltage minus one PVT. This voltage arises at node 40 because when the input voltage is greater than that shown, P channel transistors 20 and 30 are conducting and, therefore, the voltage at node 40 is equal to the input voltage minus the threshold voltages dropped across transistor 20. Given this voltage at node 40, N channel transistor 50 fully conducts while P channel transistor 48 remains off. As a result, the output voltage, $V_{OUT}$, is equal to the low voltage source, $V_{ss}$, thereby corresponding to a logic low level.

From the above, it may be appreciated that the threshold detection circuit illustrated in FIG. 1 operates to produce either a generally high or low output in response to the voltage at the input terminal 16. Further, in the embodiment shown in FIG. 1, the circuit switches states when the input voltage exceeds $V_{cc}$ plus two PVT. Therefore, the threshold level of switching for the circuit of FIG. 1 is the level defined by $V_{cc}$ plus two PVT. It should be understood, however, that this threshold level may be adjusted by varying the device ratios of the transistors within input stage 12. Thus, the particular dimensions of certain transistors within input stage 12 may be adjusted by one skilled in the art so that a greater or lesser voltage is needed in order to switch the state of detection circuit 10 and without departing from the scope of the present invention.

From a review of the detection circuit 10 in FIG. 1, it may be appreciated that the transistors of input stage 12 are all of the same conductivity-type. Indeed, in the preferred embodiment, each of these three transistors comprise P channel field effect transistors. As a result, the three transistors may be constructed according to principles known in the art which permit those transistors to be built in a single N type semiconductor region. For example, the three P channel transistors could be formed in an N tank which is formed within a P type semiconductor substrate. Because all three transistors may be formed within the same tank, they may be constructed relatively close together, thereby allowing a device to be made in a relatively small area. This construction is advantageous because smaller devices provide various benefits such as overall reduced device size.

An additional advantage of having transistors of the same semiconductor type configuration is that the voltages associated with input stage 12 may be well isolated from any additional circuitry either associated with detection circuit 10 or any other circuitry in general. In other words, input stage 12 is well isolated from any other circuitry associated with it. This isolation provides additional advantages, particularly where high voltages are analyzed by the circuit. In particular, where high voltages are applied to input stage 12, without the device isolation permitted by the preferred embodiment there is an increased possibility that the large voltages could cause a latch-up condition. As discussed above in connection with the prior art, latch-up is more likely to occur in devices which use different types of semiconductor transistors. The like type semiconductor configuration included within input stage 12 of the present invention, however, significantly reduces the possibility of this latch-up condition.

As discussed above in connection with the first row of Table 1, when the input voltage to threshold detection circuit 10 is low, the output voltage is approximately equal to $V_{cc}$. As also discussed, this output voltage is referred to as approximate due to the possible loss of voltage across N channel transistor 52. In certain instances, this loss of voltage across N channel transistor 52 may be undesirable. In particular, this loss effectively results from current which may be wasted through N channel transistor 52 rather than passing to output terminal 18. Thus, as another aspect of the present invention, FIG. 2 illustrates a second embodiment which substantially reduces or eliminates this wasted current. In particular, FIG. 2 illustrates a schematic of a threshold detection circuit indicated generally at 64. Threshold detection circuit 64 includes an input stage 66 and an output stage 68. Input stage 66 is identical to input stage 12 of detection circuit 10 shown in FIG. 1 and, therefore, the reference numerals of FIG. 1 are carried forward in FIG. 2 for that stage. Further, threshold detection circuit 64 of FIG. 2 operates generally in the same manner as detection circuit 10 of FIG. 1, but enhances the circuit output by reducing or substantially eliminating current leakage when the input of the circuit is low.

The particular devices and interconnections of output stage 68 of threshold detection circuit 64 are as follows. Input stage 66, in the same manner as input stage 12 of circuit 10 in FIG. 1, provides a node 40. Node 40 of detection circuit 64 is connected to a gate 70 of a P channel transistor 72 and a gate 74 of an N channel transistor 76. The source 78 of P channel transistor 72 is connected to the high voltage source, $V_{cc}$. The drain 80 of N channel transistor 72 is connected to the drain 82 of N channel transistor 76, thereby defining a node 84 between those two drains. Node 84 is connected to an output terminal 86 which provides the output voltage, $V_{OUT}$, of detection circuit 64.

The source 88 of N channel transistor 76 is connected to the source 90 of a P channel transistor 92. The gate 94 of P channel transistor 92 is connected to the drain 96 of P channel transistor 92. The drain 96 of P channel transistor 92 is further connected the low voltage source, $V_{ss}$. From the above, and from a comparison of output stage 68 of FIG. 2 with output stage 14 of FIG. 1, it may be appreciated that output stage 68 is distinguishable due to its inclusion and connection of P channel transistor 92. Table 2 below illustrates the additional benefits provided by the inclusion of P channel transistor 92, and is discussed in greater detail immediately below.

TABLE 2

| $V_{IN}$ | (volts) Node 40 | $V_{OUT}$ |
|---|---|---|
| 0 (lo) | ≦PVT | $V_{cc}$ (hi) |
| >$V_{cc}$ + 2 PVT (hi) | approximately $V_{IN}$ - PVT | ≦PVT (lo) |

As illustrated by the first row in Table 2, the inclusion of P channel transistor 92 improves the output signal, $V_{OUT}$, when the input signal is low. In particular, when the input signal is low, the output is equal to $V_{cc}$ rather than approximately $V_{cc}$ as was the case discussed in connection with Table 1 and FIG. 1. This result occurs as follows. When the input voltage is low, node 40 is at one PVT and this one PVT causes P channel transistor 72 to fully conduct. Since transistor 72 fully conducts, output terminal 86 is connected through P channel transistor 72 to the high voltage source, $V_{cc}$. In comparison to the embodiment of FIG. 1, however, N channel transistor 76 remains completely off due to the inclusion of P channel transistor 92. In particular, P channel transistor 92 connects one PVT to the source 88 of N channel transistor 76. Thus, the bias voltage at node 40 (one PVT) is equal to the voltage at source 88 and, therefore, transistor 76 remains completely turned off. As a result, no leakage occurs across transistor 76 as possible across transistor 52 discussed in connection with FIG. 1, above. Consequently, the output voltage, $V_{OUT}$, is equal to the full value of $V_{cc}$ with no voltage lost across transistor 76. Thus, it may be appreciated that the inclusion of P channel transistor 92 provides an improved output in the instance when the input voltage, $V_{IN}$, is low.

A review of the second row of Table 2 illustrates that the inclusion of P channel transistor 92 has a second effect in comparison to circuit 10 of FIG. 1 which includes no such analogous transistor. In particular, it should be noted that when the input voltage, $V_{IN}$, of detection circuit 64 is high (i.e., greater than $V_{cc}$ plus two PVT), the output voltage is less than or equal to one PVT rather than being equal to $V_{ss}$ as was the case in Table 1. As a practical matter, this output voltage which is less than or equal to one PVT may be assumed to indicate a logic low state for detection circuit 64. However, in some instances it is undesirable to have an output voltage which is not fully connected to either the high voltage source, $V_{cc}$, or the low voltage source, $V_{ss}$. The embodiment discussed immediately below in FIG. 3 provides additional circuitry in order to fully connect the output voltage to the low voltage source $V_{ss}$ when the input voltage, $V_{IN}$, is high.

FIG. 3 illustrates a schematic of a threshold detection circuit denoted generally at 98. Similar to the circuits of FIGS. 1 and 2, circuit 98 of FIG. 3 includes an input stage 100 and an output stage 102. Input stage 100 consists of the same components of input stage 12 and 66 of FIGS. 1 and 2 respectively, and, therefore, the same reference numerals are carried forth in FIG. 3 for input stage 100. Output stage 102 includes some of the same components as output stage 68 of FIG. 2, but for purposes of explanation new reference numerals are provide and additional circuitry are included as follows.

Node 40 is connected to the gates 104 and 106 of P channel transistor 108 and N channel transistor 110, respectively. The source 112 of P channel transistor 108 is connected to the high voltage source, $V_{cc}$. The drain 114 of P channel transistor 108 is connected to the drain 116 of N channel transistor 110. A node 118 is defined between the connections of drains 114 and 116. Node 118 is connected to an output terminal 120 in order to provide the output voltage, $V_{OUT}$. Output stage 102 further includes a P channel transistor 122 connected in a manner similar to P channel transistor 92 discussed above in connection with FIG. 2. Accordingly, the source 124 of N channel transistor 110 is connected to the source 126 of P channel transistor 122. The gate 128 of P channel transistor 122 is connected the drain 130 of P channel transistor 122. Additionally, the drain 130 of P channel transistor 122 is connected to the low voltage source, $V_{ss}$. From a review of the above, it may be appreciated that transistors 108, 110 and 122 are analogous to transistors 72, 76 and 92 discussed above in connection with FIG. 2. The remaining circuitry of output stage 102, and the additional benefits provided by that circuitry, are discussed immediately below.

Output stage 102 further includes an inverter 132 having its input 134 connected to output terminal 120 and its output 136 connected to the gate 138 of an N channel transistor 140. The drain 142 of N channel transistor 140 is connected to the source 126 of P channel transistor 122, as well as to the source 124 of N channel transistor 110. The source 144 of N channel transistor 140 is connected to the drain 130 of P channel transistor 122, as well as to the low voltage source, $V_{ss}$.

Table 3 below illustrates the input and output signals as well as the voltage levels at node 40 for threshold detection circuit 98 of FIG. 3.

TABLE 3

| $V_{IN}$ | (volts) Node 40 | $V_{OUT}$ |
| --- | --- | --- |
| 0 (lo) | ≦PVT | $V_{cc}$ (hi) |
| >$V_{cc}$ + 2 PVT (hi) | approximately | $V_{ss}$ (lo) |

TABLE 3-continued

| $V_{IN}$ | (volts) Node 40 | $V_{OUT}$ |
| --- | --- | --- |
|  | $V_{IN}$ - PVT |  |

A review of Table 3 illustrates that when the input voltage, $V_{IN}$, is low, the voltage at node 40 and the output voltage, $V_{OUT}$, are not changed in comparison to the structure of FIG. 2. The second row of Table 2, however, illustrates the effect of the additional circuitry included in output stage 102 of detection circuit 98. In particular, from the second row of Table 2, it may be appreciated that when the input voltage is greater than $V_{cc}$ plus two PVT, the output voltage is equal to the low voltage supply level, $V_{ss}$. This desirable output voltage is achieved by virtue of the feedback loop and circuitry created by inverter 132 and N channel transistor 140.

The particular operation and benefits from inverter 132 and N channel transistor 140 are as follows. When the input voltage, $V_{IN}$, is high, node 40 is biased at a voltage equal to approximately $V_{IN}$ minus PVT. Similar to the embodiment of FIG. 2, this biasing voltage causes P channel transistor 108 to fully turn off while N channel transistor 110 fully conducts. As a result of these conductive states, node 118 is initially connected to a relatively low voltage (i.e., one PVT) provided by P channel transistor 122. In the embodiment of FIG. 3, however, this relatively low voltage is inverted by inverter 132 to provide a feedback high voltage to the gate 138 of N channel transistor 140. This high voltage causes transistor 140 to conduct, thereby secondarily connecting fully conducting transistor 110 through fully conducting transistor 144 to the low voltage source, $V_{ss}$. As a result, node 118 and, consequently, output terminal 120, are connected completely to the low voltage source, $V_{ss}$, as opposed to being connected to one PVT as was the case for the embodiment of FIG. 2. Thus, it may be appreciated that threshold detection circuit 98 of FIG. 3 provides increased performance because the output voltage swings between the upper and lower voltage source levels (i.e., $V_{cc}$ and $V_{ss}$) depending upon the input voltage to the circuit. Thus, in instances where it is highly desirable or mandatory that the output voltage swing completely from one voltage source level to the other, the threshold detection circuit 98 of FIG. 3 is the desirable and preferred embodiment.

FIG. 4 illustrates the schematic of the preferred embodiment of FIG. 3 with the inclusion of two additional transistors in order to perform the inverting function illustrated by inverter 132. As a result, each of the circuit component numbers of FIG. 3 are carried forward into FIG. 4 with the addition of a P channel transistor 146 and an N channel transistor 148. Thus, the inverter 132 (shown as included within the area defined by dotted lines) has its input 134 connected to the gates 150 and 152 of P channel transistor 146 and N channel transistor 148, respectively. The source 154 of P channel transistor 146 is connected to the high voltage source, $V_{cc}$. The drain 156 of P channel transistor 146 is connected to the drain 158 of N channel transistor 148. Both drains 156 and 158 are further connected to the output 136 of inverter 132. Finally, the source 160 of N channel transistor 148 is connected to the low voltage source, $V_{ss}$.

From the description immediately above with respect to transistors 146 and 148, it may be appreciated that they perform an inverting function in accordance with principles known in the art. Thus, when the output voltage, $V_{OUT}$, is high, transistor 148 conducts while transistor 146 remains off. As a result, the output 136 of inverter 132 is connected through transistor 148 to the low voltage source, $V_{SS}$, thereby yielding a low inverter output for a high inverter input. Conversely, when the output voltage, $V_{OUT}$, is low, P channel transistor 146 fully conducts while N channel transistor 148 is off. As a result, output 136 of inverter 132 is connected to the upper voltage source, $V_{cc}$, and, therefore, the inverted voltage at output 136 is high in response to the low voltage at inverter input 134. As discussed in connection with FIG. 3, the high or low output of inverter 132 controls the gate 138 of N channel transistor 140 in order to ensure the output voltages illustrated in Table 3, above. Thus, inverter 132 comprising P channel transistor 146 and N channel transistor 148 must be constructed especially to provide the preferred output levels. Accordingly, for an input signal at inverter input 134 of one PVT or lower, the signal at output 136 must be a high enough voltage to cause N channel transistor 140 to conduct fully. Conversely, for an input signal above approximately one PVT, inverter 132 must provide an output signal such that N channel transistor 140 will not conduct.

From the above descriptions, it may be appreciated that the present invention includes various embodiments which may be used in order to provide a voltage threshold detection function. Numerous advantages are provided by the present invention. For example, an input stage having like-type switching devices permits the device to be constructed in a small area and substantially reduces or eliminates the possibility of a latch-up condition for the detection circuit. Further, the actual threshold level of switching for the circuit may be adjusted by altering the physical structure ratios of the various transistors within the circuit. Finally, additional embodiments are included in order to overcome various different considerations and ultimately provide for a preferred embodiment which yields an output which swings from the upper to lower voltage source levels in response to detecting a voltage which has passed the predetermined threshold. It should also be understood that while the present invention has been described in detail, various substitutions, modifications and alterations may be made thereto without departing from the scope and spirit of the invention as defined by the following claims.

What is claimed is:

1. A circuit for detecting when an input voltage exceeds a predetermined threshold, comprising:
    an input for receiving the input voltage; and
    a plurality of switching devices, wherein each of said switching devices comprises a first and second terminal for defining a variable conductive path, and a third terminal for receiving a signal to control said variable conductive path, said plurality comprising:
    a first switching device having said first terminal coupled to said input and said second terminal coupled to a first node;
    a second switching device having said first terminal coupled to said first node and said second terminal coupled to a second node; and
    a third switching device having said first terminal coupled to said second node, wherein each of said first, second and third switching devices are of like conductively type, and wherein said second node provides a first voltage if the input voltage is below the redetermined threshold and provides a second voltage if the input voltage is above the predetermined threshold; wherein:
    said third terminal of said first switching device is coupled to said first node;
    said third terminal of said second switching device is coupled for receiving a high voltage source; and
    said second and third terminals of said third switching device are coupled for receiving a low voltage source.

2. The circuit for detecting of claim 1, and further comprising:
    an output for providing a representative signal indicative of whether the input voltage exceeds the predetermined voltage; and
    a switching circuit coupled between said second node and said output and for providing said representative signal in response to a voltage at said second node.

3. The circuit for detecting of claim 1 wherein said first, second and third switching devices comprise P type semiconductor field effect transistors.

4. The circuit for detecting of claim 1, and further comprising:
    an output for providing a representative signal indicative of whether the input voltage exceeds the predetermined voltage;
    a fourth switching device having said first terminal coupled for receiving a high voltage source, said second terminal coupled to said output, and said third terminal coupled to said second node; and
    a fifth switching device having said first terminal coupled for receiving a low voltage source, said second terminal coupled to said output, and said third terminal coupled to said second node.

5. The circuit for detecting of claim 4 wherein said fourth switching device comprises a P channel field effect transistor and wherein said fifth switching device comprises an N channel field effect transistor.

6. The circuit for detecting of claim 1, and further comprising:
    an output for providing a representative signal indicative of whether the input voltage exceeds the predetermined voltage;
    a fourth switching device having said first terminal coupled for receiving a high voltage source, said second terminal coupled to said output, and said third terminal coupled to said second node;
    a fifth switching device having said first terminal coupled to said output, and said third terminal coupled to said second node; and
    a sixth switching device having said first terminal coupled to said second terminal of said fifth switching device, and said second and third terminals for receiving a low voltage source.

7. The circuit for detecting of claim 6 wherein said fourth and said sixth switching devices comprise P channel field effect transistors, and wherein said firth switching device comprises an N channel field effect transistor.

8. The circuit for detecting of claim 1, and further comprising:

an output for providing a representative signal indicative of whether the input voltage exceeds the predetermined voltage;

a fourth switching device having said first terminal coupled for receiving a high voltage source, said second terminal coupled to said output, and said third terminal coupled to said second node;

a fifth switching device having said first terminal coupled to said output, and said third terminal coupled to said second node;

a sixth switching device having said first terminal coupled to said second terminal of said fifth switching device, and said second and third terminals for receiving a low voltage source;

a seventh switching device having said first terminal coupled to said second terminal of said fifth switching device, and said second terminal for receiving a low voltage source; and an inverting circuit having an inverter input coupled to said output and an inverter output coupled to said third terminal of said seventh switching device.

9. The circuit for detecting of claim 8 wherein said fifth and seventh switching devices comprise N channel field effect transistors, and wherein said fourth and sixth switching devices comprise P channel field effect transistors.

10. The circuit for detecting of claim 8 wherein said inverting circuit comprises:

an eighth switching device having said first terminal coupled for receiving a high voltage, said second terminal coupled to said third terminal of said seventh switching device and said third terminal coupled to said output; and a ninth switching device having said first terminal coupled to said second terminal of said seventh switching device, said second terminal coupled for receiving a low voltage and said third terminal coupled to said output.

11. The circuit for detecting of claim 10 wherein said eighth switching device comprises a P channel field effect transistor and wherein said ninth switching device comprises an N channel field effect transistor.

12. The circuit for detecting of claim 1 wherein said first, second and third switching devices comprise field effect transistors.

13. A circuit for detecting when an input voltage exceeds a predetermined threshold, comprising:

an input for receiving the input voltage; and a first P channel transistor having a source coupled to said input and a drain coupled to a first node;

a second P channel transistor having a source coupled to said first node and a drain coupled to a second node; and a third P channel transistor having a source coupled to said second node, and wherein said second node provides a first voltage if the input voltage is below the predetermined threshold and provides a second voltage if the input voltage is above the predetermined threshold; wherein:

a gate of said first P channel transistor is coupled to said first node;

a gate of said second P channel transistor is coupled for receiving a high voltage source; and a drain and gate of said third P channel transistor are coupled for receiving a low voltage source.

14. The circuit for detecting of claim 13, and further comprising:

an output for providing a representative signal indicative of whether the input voltage exceeds the predetermined voltage;

a fourth P channel transistor having a source coupled for receiving a high voltage source, a drain coupled to said output, and a gate coupled to said second node;

a first N channel transistor having a source coupled to said output, and a gate coupled to said second node;

a fifth P channel transistor having a source coupled to a drain of said first N channel transistor, and a drain and gate for receiving a low voltage source;

a second N channel transistor having a drain coupled to said drain of said first N channel transistor, and a source for receiving a low voltage source; and an inverting circuit having an inverter input coupled to said output and an inverter output coupled to said gate of said second N channel transistor.

15. The circuit for detecting claim 14, and further comprising:

an output for providing a representative signal indicative of whether the input voltage exceeds the predetermined voltage; and a switching circuit coupled between said second node and said output and for providing said representative signal in response to a voltage at said second node.

16. A circuit for detecting when an input voltage exceeds a predetermined threshold, comprising:

an input for receiving the input voltage; and a first P channel transistor having a source coupled to said input and a drain coupled to a first node;

a second P channel transistor having a source coupled to said first node and a drain coupled to a second node;

a third P channel transistor having a source coupled to said second node, and wherein said second node provides a first voltage if the input voltage is below the predetermined threshold and provides a second voltage if the input voltage is above the predetermined threshold;

an output for providing a representative signal indicative of whether the input voltage exceeds the predetermined voltage;

a fourth P channel transistor having a source coupled for receiving a high voltage source, a drain coupled to said output, and a gate coupled to said second node;

a first N channel transistor having a source coupled to said output, and a gate coupled to said second node;

a fifth P channel transistor having a source coupled to said a drain of said first N channel transistor, and a drain and gate for receiving a low voltage source;

a second N channel transistor having a drain coupled to said drain of said first N channel transistor, and a source for receiving a low voltage source; and an inverting circuit having an inverter input coupled to said output and an inverter output coupled to said gate of said second N channel transistor.

17. The circuit for detecting of claim 16, and further comprising:

an output for providing a representative signal indicative of whether the input voltage exceeds the predetermined voltage; and a switching circuit coupled between said second node and said output and for providing said representative signal in response to a voltage at said second node.

18. The circuit for detecting of claim 16 wherein:
a gate of said first P channel transistor is coupled to said first node;
a gate of said second P channel transistor is coupled for receiving a high voltage source; and
a drain and gate of said third P channel transistor are coupled for receiving a low voltage source.

* * * * *